United States Patent
Chen et al.

(10) Patent No.: US 7,153,744 B2
(45) Date of Patent: Dec. 26, 2006

(54) METHOD OF FORMING SELF-ALIGNED POLY FOR EMBEDDED FLASH

(75) Inventors: Han-Ping Chen, Hsin-Chu (TW); Chung-Yi Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/822,505

(22) Filed: Apr. 12, 2004

(65) Prior Publication Data

US 2005/0127435 A1     Jun. 16, 2005

Related U.S. Application Data

(63) Continuation-in-part of application No. 10/727,272, filed on Dec. 3, 2003.

(60) Provisional application No. 60/540,825, filed on Jan. 30, 2004.

(51) Int. Cl.
*H01L 21/336* (2006.01)

(52) U.S. Cl. .................. 438/267; 438/266

(58) Field of Classification Search ............... 438/267, 438/266, 257, 260, 258, 259; 257/E21.682, 257/E21.103, E21.18, E21.4
See application file for complete search history.

(56) References Cited

U.S. PATENT DOCUMENTS

| | | | |
|---|---|---|---|
| 6,077,733 A | 6/2000 | Chen et al. | |
| 6,136,710 A * | 10/2000 | Quek et al. | 438/691 |
| 6,174,767 B1 | 1/2001 | Chi | |
| 6,225,646 B1 | 5/2001 | Gardner et al. | |
| 6,261,905 B1 | 7/2001 | Chen et al. | |
| 6,435,942 B1 | 8/2002 | Jin et al. | |
| 6,436,764 B1 | 8/2002 | Hsieh | |
| 6,436,769 B1 | 8/2002 | Kanamori | |
| 6,440,796 B1 | 8/2002 | Sung | |
| 6,441,429 B1 | 8/2002 | Hsieh et al. | |
| 6,451,654 B1 | 9/2002 | Lin et al. | |
| 6,451,698 B1 | 9/2002 | Au et al. | |
| 6,451,699 B1 | 9/2002 | Gregory | |
| 6,464,855 B1 | 10/2002 | Chadda et al. | |
| 6,465,836 B1 | 10/2002 | Lin et al. | |
| 6,465,841 B1 | 10/2002 | Hsieh et al. | |
| 6,468,863 B1 | 10/2002 | Hsieh et al. | |
| 6,479,348 B1 | 11/2002 | Kamal | |
| 6,482,700 B1 * | 11/2002 | Chen et al. | 438/267 |
| 6,486,032 B1 | 11/2002 | Lin et al. | |
| 6,489,649 B1 | 12/2002 | Kobayashi et al. | |
| 6,492,231 B1 | 12/2002 | Liu et al. | |
| 6,504,206 B1 | 1/2003 | Sung et al. | |
| 6,524,167 B1 | 2/2003 | Tsai et al. | |
| 6,524,915 B1 * | 2/2003 | Kim et al. | 438/267 |

(Continued)

Primary Examiner—Walter Lindsay, Jr.
(74) Attorney, Agent, or Firm—Haynes and Boone, LLP (57) ABSTRACT

A method of manufacturing a microelectronic device including, in one embodiment, providing a substrate having a plurality of partially completed microelectronic devices including at least one partially completed memory device and at least one partially completed transistor. At least a portion of the partially completed transistor is protected by forming a first layer over the portion of the partially completed transistor to be protected during a subsequent material removal step. A second layer is formed substantially covering the partially completed memory device and the partially completed transistor. Portions of the second layer are removed leaving a portion of the second layer over the partially completed memory device. At least a substantial portion of the first layer is removed from the partially completed transistor after the portions of the second layer are removed.

24 Claims, 7 Drawing Sheets

U.S. PATENT DOCUMENTS

| | | |
|---|---|---|
| 6,528,844 B1 | 3/2003 | Hopper et al. |
| 6,531,732 B1 | 3/2003 | Sugita et al. |
| 6,531,734 B1 | 3/2003 | Wu |
| 6,534,821 B1 | 3/2003 | Hsieh et al. |
| 6,730,565 B1 * | 5/2004 | Cho et al. .................. 438/266 |
| 6,855,602 B1 * | 2/2005 | Chang et al. ................ 438/264 |
| 2002/0119629 A1 | 8/2002 | Kim et al. |
| 2002/0142543 A1 | 10/2002 | Lin et al. |
| 2002/0142545 A1 | 10/2002 | Lin |
| 2003/0052361 A1 | 3/2003 | Liu et al. |

* cited by examiner

METHOD OF FORMING SELF-ALIGNED POLY FOR EMBEDDED FLASH

CROSS-REFERENCE

This application is a continuation-in-part of U.S. patent application "SEMICONDUCTOR DEVICE HAVING SUBSTANTIALLY PLANAR CONTACTS AND BODY,", Ser. No. 10/727,272, filed Dec. 3, 2003, having Chung-Yi Yu, C. H. Loa, and J. H. Tsai named as inventors, the entire disclosure of which is incorporated herein by reference.

This application also claims the benefit of provisional application "METHOD OF FORMING SELF-ALIGNED POLY FOR EMBEDDED FLASH," Ser. No. 60/540,825 filed Jan. 30, 2004, having Chung-Yi Yu and Han-Ping Chen named as inventors.

BACKGROUND

The present disclosure relates generally to the field of integrated circuit fabrication and methods of forming polysilicon layers employed therein.

The demand for storage devices that have a small package size and a high storage density have increased due to the creation of many new applications that require high density storage devices. Accordingly, semiconductor device geometries continue to dramatically decrease in size, to the extent that existing devices routinely have feature geometries smaller than 65 nm.

However, the manufacture of memory devices and other storage devices are plagued by a myriad of problems, often attributable to topographic differences between memory devices and supporting microelectronic devices. Such problems may be associated with over-etching, over-planarizing, and/or otherwise damaging some features, while other features go undamaged.

Accordingly, what is needed in the art is an integrated circuit device and method of manufacture thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
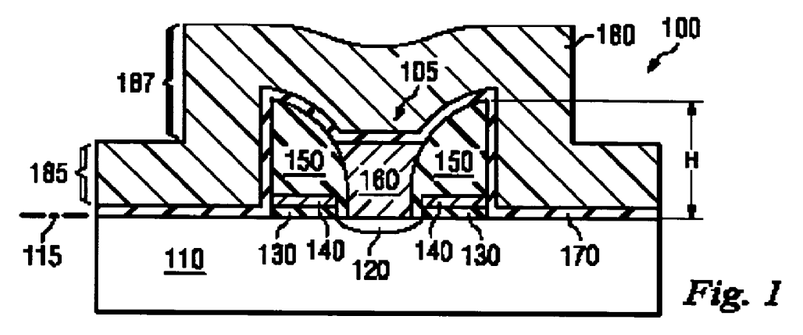
FIGS. 1–5 are sectional views of one embodiment of a microelectronic device during intermediate stages of manufacture according to aspects of the present disclosure.

Referring to FIG. 1, illustrated is a sectional view of one example of a split gate field effect transistor (SGFET) device 100 in an intermediate stage of manufacture according to aspects of the present disclosure. The SGFET device 100 may be a single-junction semiconductor device. The device 100 may also be one of a plurality or array of SGFET cells included in a semiconductor device. However, for the purpose of clarity and brevity, FIG. 1 only illustrates a single device 100. In addition, although aspects of the present disclosure are described in reference to a SGFET device, those skilled in the art will recognize that the present disclosure may be readily adapted to other semiconductor devices. For example, aspects of the present disclosure are applicable or readily adaptable to stacked gate technology and other transistor technology employed in flash memory.

The device 100 includes a substrate 110 having a source region 120 formed therein. The substrate 110 may be a single crystal or other silicon substrate, a silicon-on-insulator (SOI) substrate comprising a silicon or germanium epitaxial layer on a silicon or sapphire substrate, a plastic or other flexible substrate, or other conventional or future-developed substrates. The substrate 110 may be or include a contact to a semiconductor device or interconnect. For example, the substrate 110 may be or include a semiconductor wafer or other layers formed on a semiconductor substrate. The source region 120 may be formed by implanting phosphorus, boron and/or other dopants by diffusion, ion implantation, and/or other processes. In one embodiment, the source region 120 may be formed in a heavier doped region or active region in the substrate 110. The substrate 110 may also include other features not shown in FIG. 1, such as isolation regions on opposing sides of the source region 120, including those formed by local oxidation of silicon (LOCOS) and shallow trench isolation (STI). Accordingly, the particular compositions of the substrate 110 and the source region 120 and other features formed in the substrate 110 are not limited by the scope of the present disclosure.

The device 100 also includes gate oxide layers 130 formed on the substrate 110, split gates 140 formed on the gate oxide layers 130, spacers 150 formed on the split gates 140, and a source interconnect 160 formed between the spacers 150 and over the source region 120. The gate oxide layers 130, split gates 140 and spacers 150 may be collectively referred to as a gate structure 105. The gate structure 105 may be formed by depositing an oxide layer and a gate material layer on the substrate 110, etching an opening therein to expose a portion of the substrate and define the gate oxide layers 130 and the split gates 140, forming a spacer material layer on the oxide layer and the exposed substrate portion, and etching the spacer material layer to form the spacers 150. In one embodiment, the formation of the source region 120 may employ the split gates 140 as a mask prior to depositing the spacer material layer. After the spacers 150 are formed, the source interconnect 160 may be formed over the source region 120 and between the spacers 150, possibly to a thickness that is less than a height H of the gate structure 105, as shown in FIG. 1. In one embodiment, the spacers 150 may isolate the split gates 140 from the source interconnect 160, such that the split gates 140 may be biased by capacitive coupling upon the biasing of the source interconnect 160. The patterning steps described above may include photo-lithography, maskless photo-lithography, contact lithography, plasma and/or dry etching, ion milling, wet etching, chemical etching and/or other processes.

The gate oxide layers 130 may comprise $SiO_2$, $Ta_2O_5$, $Hf_2O$, $ZrO_2$ and/or other dielectric materials to provide a desired equivalent oxide thickness, and may be formed by atomic layer deposition (ALD), chemical vapor deposition (CVD), plasma enhanced CVD (PECVD), physical vapor deposition (PVD), thermal or rapid-thermal-processing (RTP) oxidation, and/or in-situ steam generation (ISSG) RTP oxidation. The gate oxide layers 130 may have a thickness of about 100 angstroms or less.

The split gates 140 may comprise metal silicide, doped and/or undoped polysilicon, metal oxide, a barrier layer and metal conductor, a barrier layer and a non-metal conductor and/or other materials that provide adequate electrical device performance based upon application-specific requirements. The split gates 140 may be formed by ALD, CVD, PECVD, PVD and/or other processes. The split gates 140 may have a width ranging between about 100 angstroms and about 4000 angstroms and may have a thickness ranging between about 1 angstrom and about 800 angstroms.

The spacers 150 may comprise $SiO_2$ and/or other dielectric materials, and may be selected to comply with the thermal budget of the device fabrication process. The spacers 150 may be formed by ALD, CVD, PECVD, thermal or RTP oxidation, ISSG RTP oxidation, PVD and/or other processes. The spacers 150 may have a thickness ranging between about 10 nm and about 400 nm and a width ranging between about 10 angstroms and about 4000 angstroms.

The source interconnect 160 may comprise one or more conductive materials, including polysilicon, metal silicide and/or metal oxide, and may also include a barrier layer and/or cladding such as Ti, Ta, TiN, TaN, TiW, CN, SiC, and SiCO. The source interconnect 160 may be formed by ALD, CVD, PECVD, PVD and/or an electroplating copper process (ECP), and may have a thickness ranging between about 100 angstroms and about 4000 angstroms and a width ranging between about 10 angstroms and about 4000 angstroms. Moreover, as shown in FIG. 1, the source interconnect 160 may have a tapered cross-section profile or a vertical profile, depending on the geometries of neighboring features.

The SGFET device 100 may also include an isolation layer 170 employed to isolate the previously discussed features from subsequently formed interconnects. The isolation layer 170 may comprise $SiO_2$, $Si_3N_4$, and/or other dielectric materials, possibly selected to comply with the thermal budget of the fabrication process. The isolation layer 170 may be formed by ALD, CVD, PECVD, a spin-on process, thermal or RTP oxidation, ISSG RTP oxidation and/or PVD, and may have a thickness ranging between about 1 angstrom and about 300 angstroms.

The SGFET device 100 also includes an interconnect layer 180 that may be employed as a bit line, word line, and/or other interconnect (collectively referred to herein as line interconnects). In the embodiment shown in FIG. 1, the interconnect layer 180 is formed by blanket deposition over the isolation layer 170, although selective deposition may also be employed. The interconnect layer 180 may comprise one or more conductive materials, such as a doped or un-doped polysilicon, metal silicide, and/or metal oxide, and may include a barrier layer comprising Ti, Ta, TiN, TaN, TiW, CN, SiC, and/or SiCO. The interconnect layer 180 may be formed by ALD, CVD, PECVD, ECP, and/or PVD, and may have a thickness ranging between about 50 angstroms and about 4000 angstroms and a width ranging between about 50 angstroms and about 4000 angstroms. In one embodiment, the thickness of the interconnect layer 180 may be less than the height H of the gate structure 105.

The features described above may be referred to as topographic features for the purpose of the present disclosure. That is, as shown in FIG. 1, many of the features may have varying heights relative to a reference plane 115 that is substantially parallel to a principal plane of the substrate 110. For example, the gate structure 105 extends to a height H above the reference plane 115, whereas the source interconnect 160 has a thickness that is less than the height H of the gate structure 105. Similarly, the interconnect layer 180 includes a first portion 185 having a thickness that is less than the height H and a second portion 187 having a thickness that is greater than the height H. As described above, conventional methods of planarizing such topographic features can provide inadequate results, including rounded corners, excessive residue build-up and jagged edges.

Figure 2:
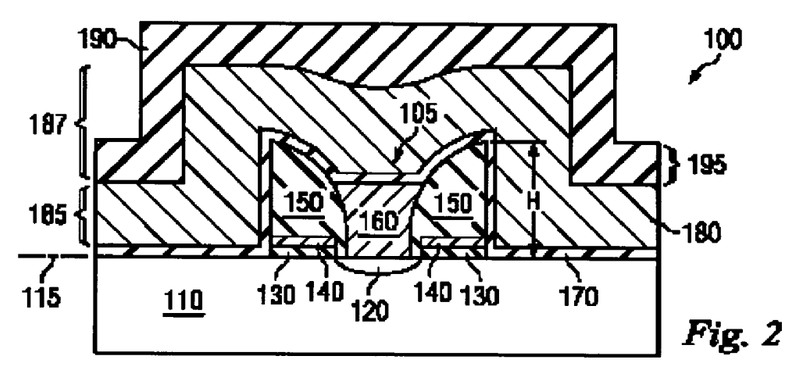

Referring to FIG. 2, illustrated is a sectional view of one embodiment of the device 100 shown in FIG. 1 after a cap layer 190 is formed over the interconnect layer 180. The cap layer 190 may comprise $SiO_2$, $Si_3N_4$, and/or other dielectric materials that may be compatible with the thermal budget and mechanical stress induced by subsequent chemical mechanical polish (CMP) processing. The cap layer 190 may be blanket or selectively deposited by ALD, CVD, PECVD, a spin-on process, thermal or RTP oxidation, ISSG RTP oxidation, and/or PVD, and may have a thickness ranging between about 100 angstroms and about 2000 angstroms. In one embodiment, a portion 195 of the cap layer 190 may extend below the height H of the gate structure 105, such as when the thickness of the interconnect layer 180 is less than the height H of the gate structure 105, whereby the portion 195 may be employed as a mask during subsequent processing.

Figure 3:
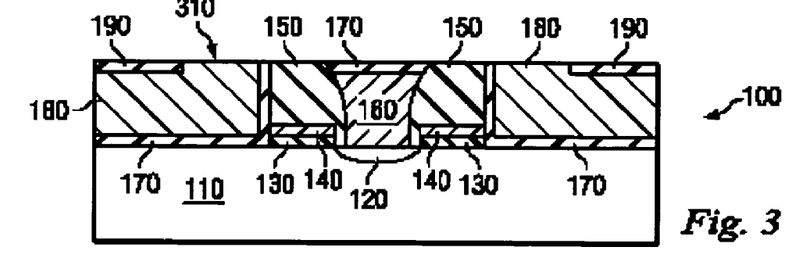

Referring to FIG. 3, illustrated is a sectional view of the SGFET device 100 shown in FIG. 2 after undergoing a planarizing process. The planarizing process may form a substantially planar surface 310 across the spacers 150, the source interconnect 160, the isolation layers 170, the interconnect layer 180, and/or the cap layer 190, or the remaining portions thereof, collectively. In one embodiment, the CMP parameters may be selected such that a portion of the cap layer 190 having a thickness of at least about 200 angstroms remains after polishing. Allowing for at least 200 angstroms of the cap layer 190 may provide adequate protection against oxidation in subsequent processing steps.

The planarizing demonstrated in FIG. 3 may include chemical-mechanical polishing (CMP) performed under conventional CMP parameters. However, in one embodiment, the parameters of the CMP process may vary from those conventionally employed, which may reduce or eliminate the inadequate results of conventional planarizing methods. For example, a higher downward force may be applied to the substrate 110 during CMP, such as by a substrate holder or polishing head, thereby increasing a polishing rate ratio. In one example, the downward force applied during CMP may be about 5.0 psi. The downward force may also range between about 5.0 psi and about 10.0 psi. In contrast, conventional CMP processes typically employ a downward force that is less than about 4.2 psi.

The polishing rate ratio may be a comparison of the polishing rate of substrate areas having features of higher profiles to the polishing rate of substrate areas having features of lower profiles. Accordingly, increasing this polishing rate ratio, such as by increasing the downward force employed during polishing, may remove material from taller features at a faster rate than the removal rate of material from shorter features. In other words, high topographic areas may be polished faster than low topographic areas when a higher polishing rate ratio is achieved. By removing the material from the high topographic areas on the substrate 110 faster than from the low topographic areas, the rounded corners and jagged edges between higher topographic features that result during conventional planarizing methods may be reduced or eliminated. As such, corners may be more defined and interfaces between neighboring topographic features may be cleaner and substantially free of residue build-up and jagged edges.

Increasing the downward force may not be the only manner in which a higher polishing rate ratio may be provided. For example, increasing the rotation speed employed during CMP may also increase the polishing rate ratio. Thus, in one embodiment, the polishing head to which the substrate 110 is coupled may be rotated at a speed ranging between about 75 rpm and about 200 rpm. In a more specific embodiment, the polishing head speed may range between about 90 rpm and about 100 rpm. In contrast, conventional CMP processes typically employ a polishing head speed that is less than about 63 rpm.

Similarly, the platen employed during CMP to polish the topographic features formed on the substrate 110 may be rotated at a speed ranging between about 65 rpm and about 150 rpm. In a more specific embodiment, the platen speed may range between about 85 rpm and about 95 rpm. In contrast, conventional CMP processes typically employ a platen speed that is less than about 57 rpm.

The selectivity of the features undergoing CMP may also be adjusted to achieve a desired polishing rate ratio. That is, the materials employed to form the topographic features may be selected based on their resistance to CMP. Thus, higher topographic features may comprise materials selected based on their lower resistance to CMP, whereas lower topographic features may comprise materials selected based on their higher resistance to CMP. In other words, the selectivity of the materials employed to form the higher topographic features may be greater than the selectivity of the materials employed to form the lower topographic features. In one embodiment, the selectivity of the higher topographic features may be about three times to about five times the selectivity of the lower topographic features, such that the polishing rate ratio may be about 3:1, or range between about 3:1 and about 5:1. For example, in the embodiment shown in FIGS. 1 and 2, the cap layer 190 may comprise $Si_3N_4$ and the interconnect layer 180 may comprise polysilicon. Because polysilicon is about three times as resistant to CMP as $Si_3N_4$, a polishing rate ratio of about 3:1 may be achieved.

An increased polishing rate ratio may also be achieved by selection of the chemical composition of a slurry used during CMP. That is, the slurry may be more selective to the higher topographic features than to the lower topographic features. In one embodiment, the selectivity of the slurry to the higher topographic features may be three times as great as the selectivity of the slurry to the lower topographic features.

Moreover, conventional fabrication processes employing plasma and/or chemical etch back do not incorporate the cap layer 190 with CMP, thereby increasing the likelihood of residue build-up and possibly leaving jagged edges. However, by incorporating the cap layer 190 according to aspects of the present disclosure, such as one having one-third the resistivity to planarizing as underlying layers (e.g., the interconnect layer 180), the occurrence of residue build-up may be reduced or eliminated and the formation of non-uniform edges at interfaces between higher topographic features may be prevented.

Figure 4:
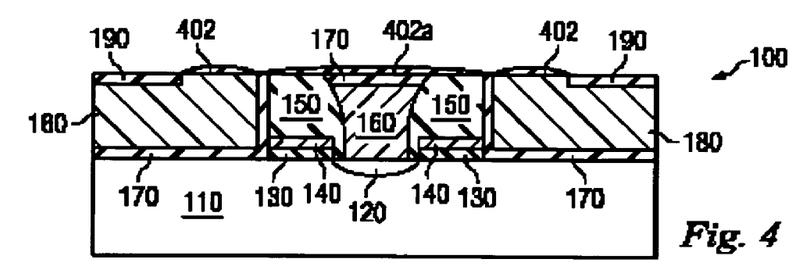

Referring to FIG. 4, illustrated is a section view of the device 100 shown in FIG. 3 in a subsequent stage of manufacture. A mask layer 402 may be formed over portions of the source interconnect 160 and interconnect layer 180 exposed by the previous planarizing process, including in some embodiments a relatively thin portion over the spacers 150 and the interconnect 160, designated as mask layer 402a. In one embodiment, the cap layer 190 includes $SiO_2$, and the mask layer 402 includes $Si_3N_4$. In another embodiment, the cap layer 190 includes $Si_3N_4$ and the mask layer 402 includes $SiO_2$. The mask layer 402 may be blanket or selectively formed by ALD, CVD, PECVD, spin-on method, ISSG oxidation, and/or PVD. Formation of the mask layer 402 may also include an anneal process, such as thermal or RTP oxidation. The process conditions for depositing the mask layer 402 may include a process temperature ranging between about 550° C. and about 950° C. in a process environment that may include $N_2$, $O_2$, and/or 1,2-Dichloro-ethylene (DCE). The mask layer 402 may have a thickness ranging between about 1 angstrom and about 2000 angstroms, although the thickness may vary depending upon the design rule specification of the SGFET device 100. The mask layer 402 may provide protection for the areas where polysilicon may reside during subsequent etch processes.

Figure 5:
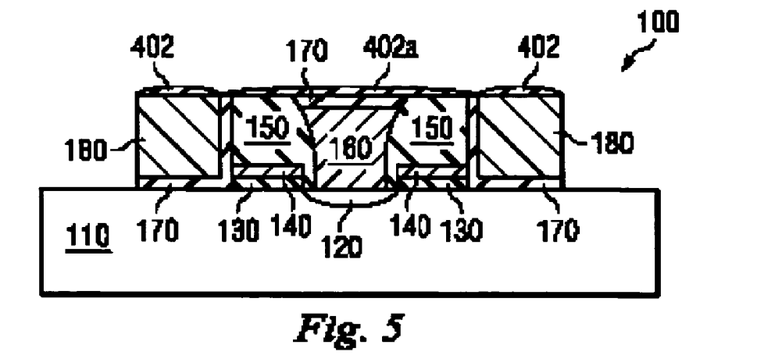

Referring to FIG. 5, illustrated is a section view of the device 100 shown in FIG. 4 after the removal of the remaining portions of the cap layer 190 and portions of the isolation layer 170 and the interconnect layer 180. The mask layer 402 may be employed for such removal, as shown in FIG. 5, and may then be removed. The removal of the cap layer 190, the isolation layer 170, the interconnect layer 180, and/or the mask layer 402 may be accomplished by a selective plasma and/or chemical etch. The mask layer 402 may prevent etching of the underlying materials. The $SiO_2$ spacers 150 may also prevent etching of the underlying materials. However, the material underlying the cap layer 190 may be removed.

The use of the mask layer 402 in combination with the CMP process according to aspects of the present disclosure may provide the desired box shape for the SGFET structure. The implementation of the mask layer 402 may also allow for resulting source and drain contacts to have substantially clean and planar surfaces after the removal of portions of the isolation layer 170 and the interconnect layer 180. A clean and planar surface for the source and drain contacts may permit good contact of subsequently formed metal silicide, refractory barrier metal, and/or contact fill metallization. In contrast, rough and/or jagged surfaces at the contacts of the SGFET often cause high contact resistance, pinholes in subsequently formed features and promotion of metal diffusion, possibly resulting in catastrophic electrical failure of the SGFET.

Figure 6:
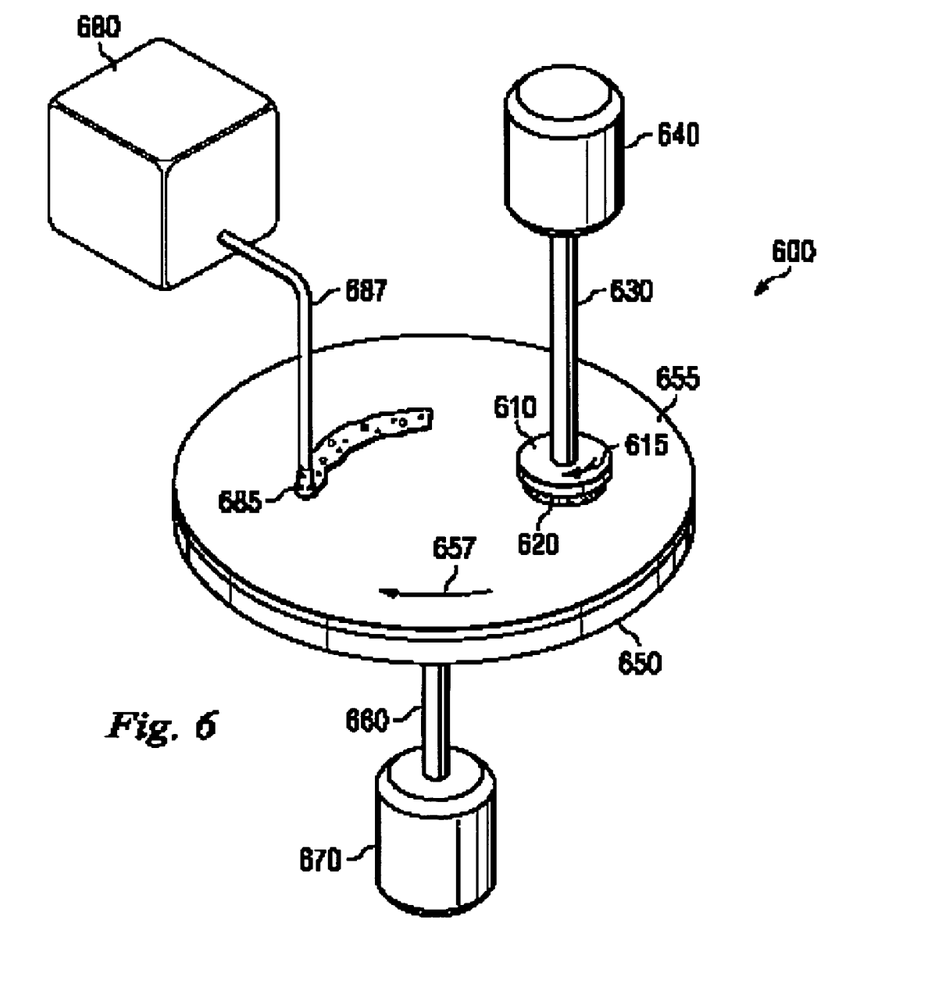
FIG. 6 is a perspective view of one embodiment of a system for planarizing topographic features formed on a substrate according to aspects of the present disclosure.

Referring to FIG. 6, illustrated is a perspective view of a planarizing system 600 constructed according to aspects of the present disclosure. The system 600 is one environment in which the planarizing methods described above may be employed in the manufacture of the SGFET device of FIG. 2. Those skilled in the art will recognize that only certain features of the system 600 are described herein, and that the system 600 may include many other features not described herein or shown in FIG. 6.

The system 600 includes a polishing head 610 to which a substrate 620 (such as the substrate 100 shown in FIG. 2 may be detachably coupled. The polishing head 610 may be coupled by a shaft 630 to first driving means 640, which may be configured to rotate the polishing head 310 as indicated by the arrow 315. The first driving means 340 may rotate the polishing head 310 at speeds ranging between about 75 rpm and about 200 rpm, although speeds greater than about 200 rpm may also be possible. The first driving means 640 may also be configured to apply a force to the polishing head 610 to contact topographic features formed on the substrate 620 to a polishing platen 650. The force applied by the first driving means 640 may range between about 2.0 psi and about 10.0 psi, although higher forces may also be possible.

The platen 650 may include a polishing pad 655 of conventional or future-developed composition and geometry. The platen 650 may be coupled by a shaft 660 to second driving means 670, which may be configured to rotate the platen 650 as indicated by the arrow 657. The second driving means 670 may rotate the platen 650 at speeds ranging between about 65 rpm and about 150 rpm, although speeds greater than about 150 rpm may also be possible. The second driving means 670 may also be configured to apply a force to the platen 650 to contact the platen 650 (or polishing pad 655) to topographic features formed on the substrate 620. The force applied by the second driving means 670 may range between about 2.0 psi and about 10.0 psi. Moreover, the first and second driving means 640, 670 may cooperate to collectively apply a polishing force to the topographic features formed on the substrate 620 that ranges between about 5.0 psi and about 10.0 psi, although higher forces are also possible. Control of the first and second driving means 640, 670 to apply the polishing force to the topographic features formed on the substrate 620 and/or to rotate the polishing head 610 and/or platen 650 may be handled by means not shown in FIG. 6, such as a dedicated computer device.

The polishing system 600 may also include a slurry delivery system 680 which may deliver slurry 685 to the platen 650 (or polishing pad 655) through a conduit 687. The composition of the slurry 685 may be selected based on the desired selectivity of the slurry to the various topographic features formed on the substrate 620, as discussed above with reference to FIG. 5.

By employing one or a combination of a higher polishing force and faster polishing speeds compared to those typically employed in conventional planarizing methods, the system 600 may reduce or eliminate the rounded corners, residue build-up and jagged edges resulting from conventional planarizing. For example, as described above, one or a combination of a polishing force of about 5.0 psi applied by the first and/or second driving means 640, 670 a polishing head 610 speed of about 93 rpm and a platen 650 speed of about 87 rpm may provide a higher polishing rate ratio during CMP, such that higher topographic features formed on the substrate 620 may be polished at a faster rate than lower topographic features. Application-specific selection of the composition of the slurry 685 may also achieve or contribute to a sufficiently high polishing rate ratio.

Figure 7:
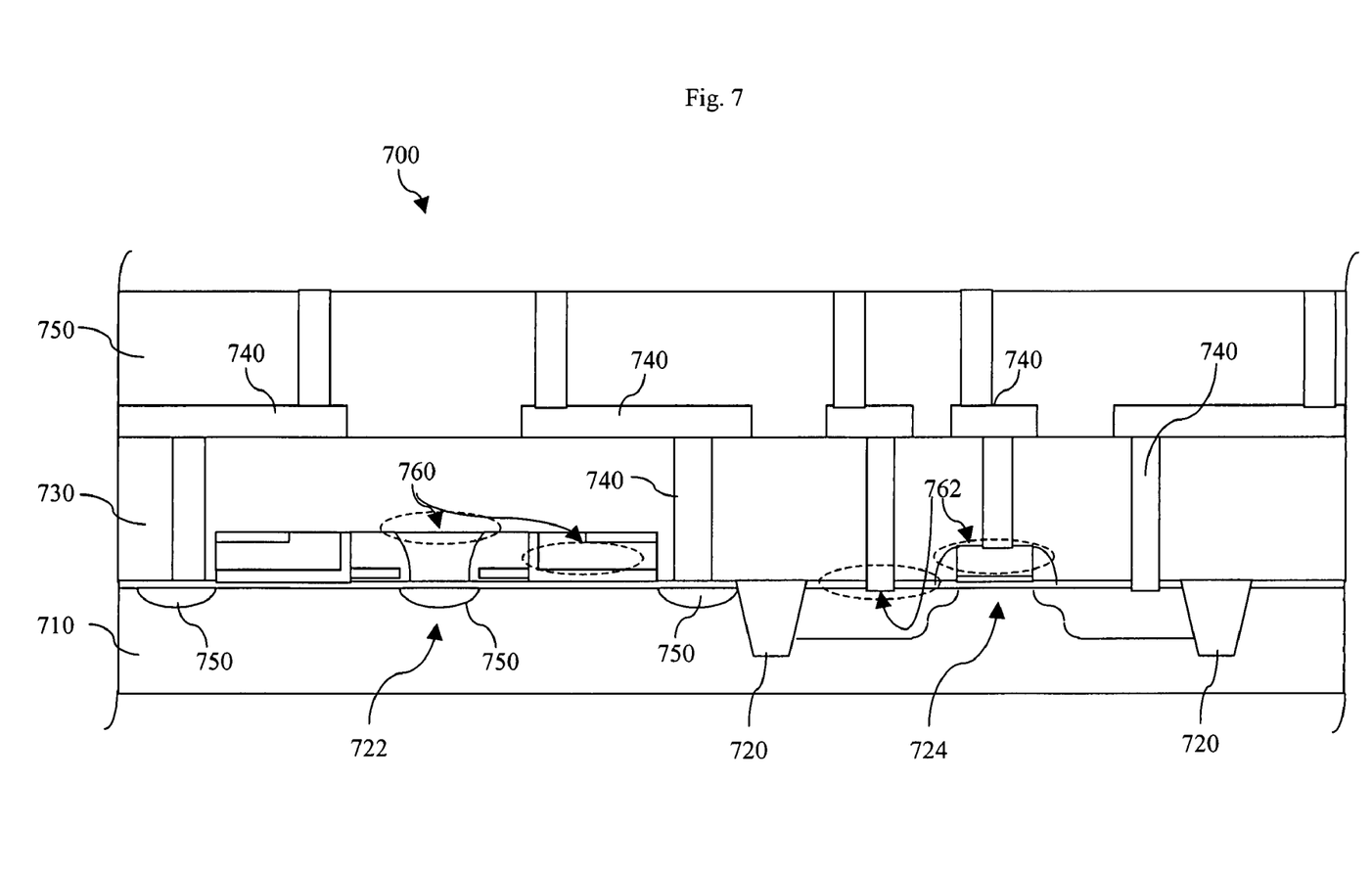
FIG. 7 is a sectional view of one embodiment of an integrated circuit device constructed according to aspects of the present disclosure.

Referring to FIG. 7, illustrated is a sectional view of an integrated circuit device 700 constructed according to aspects of the present disclosure. The integrated circuit device 700 is one environment in which aspects of the above described device 100 may be implemented. For example, the integrated circuit device 700 includes a plurality of devices 722 located on or in a substrate 710, one or more of which may be substantially similar to the microelectronic device 100 shown in FIG. 5. The devices 722 may be interconnected and/or connected to one or more other microelectronic devices 724 manufactured on or in the substrate 710. The microelectronic devices 724 may be or include metal-oxide-semiconductor field-effect-transistors (MOSFETs), FinFETs, and/or other conventional and/or future developed semiconductor devices.

The integrated circuit device 700 also includes interconnects 740 extending along and/or through one or more dielectric layers 730, 750 to ones of the plurality of microelectronic devices 722, 724. The dielectric layers 730, 750 may include silicon dioxide, Black Diamond® (a product of Applied Materials of Santa Clara, Calif.), and/or other materials, and may be formed by CVD, ALD, PVD, spin-on coating, and/or other processes. The dielectric layers 730, 750 may have a thickness ranging between about 2000 angstroms and about 15,000 angstroms. The interconnects 740 may comprise copper, tungsten, gold, aluminum, carbon nano-tubes, carbon fullerenes, refractory metals and/or other materials, and may be formed by CVD, PECVD, ALD, PVD, and/or other processes.

The integrated circuit device 700 may include a non-planar topography at the level of the devices 722, 724. For example, the device 722 may include a flash device such as an SGFET, while device 724 may include a MOSFET and/or other microelectronic devices. The device 722 may be included in a memory array or memory cell area, while the device 724 may be included in a periphery area of the integrated circuit device 700. The topography may substantially vary between devices 722, 724, such that problems may arise during a CMP process, such as dishing, fence formation, cracking, and/or other process related complications. The present disclosure contemplates a method for providing self-aligned gate electrodes or other contacts to both the periphery area and the memory array area of the integrated circuit device 700.

In one embodiment, the devices 722, 724 may include features 760, 762 that may be formed at different manufacturing process steps, respectfully. For example, the feature 760 may be formed while areas proximate the feature 762 may be protected to prevent damage to the underlying features. The feature 762 may be protected by a temporary layer which may include photoresist, $Si_3N_4$, polymer, $SiO_2$, and/or other materials. Alternatively, the feature 762 may be formed while the feature 760 may be protected to prevent damage to features located below and/or proximate the feature 760. The feature 760 may be protected by a temporary layer which may include photoresist, $Si_3N_4$, polymer, $SiO_2$, and/or other materials.

The sequence in which the features 760, 762 may be formed may be selected to prevent damage to proximate features and device layers. For example, the formation of polysilicon, a metal silicide, and/or polyoxide for the features 760 may include the protection of the features 760 by the temporary layer. The temporary layer may prevent CMP dishing and/or damage that may occur during the formation of the features 760. Thus, protecting the features 762 may allow for electrical contacts to be formed self-aligned to drain/source areas 750 of the device 722.

Figure 8A:
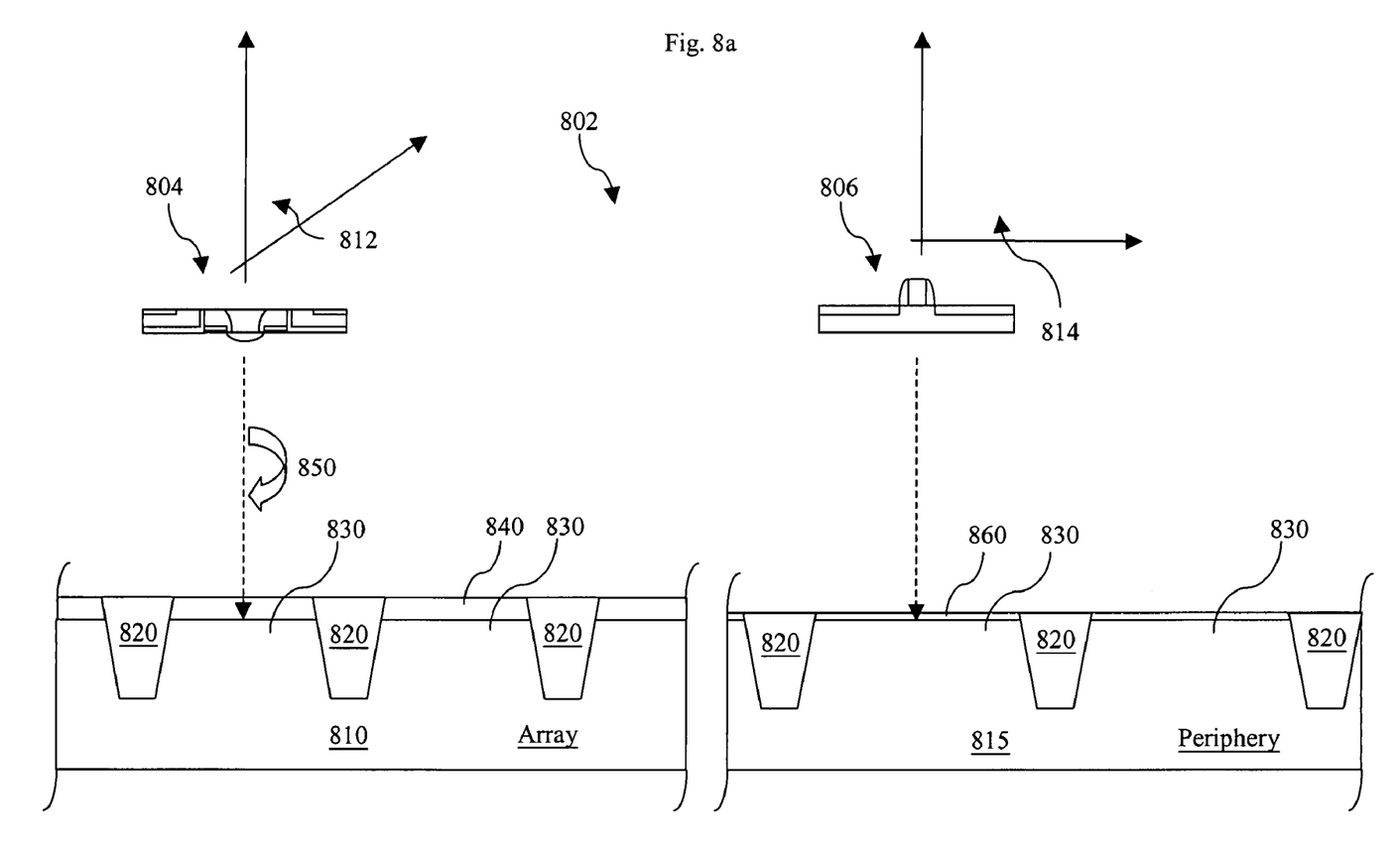
FIGS. 8a and 8b are sectional views of another embodiment of a microelectronic device constructed according to aspects of the present disclosure.
Figure 8B:
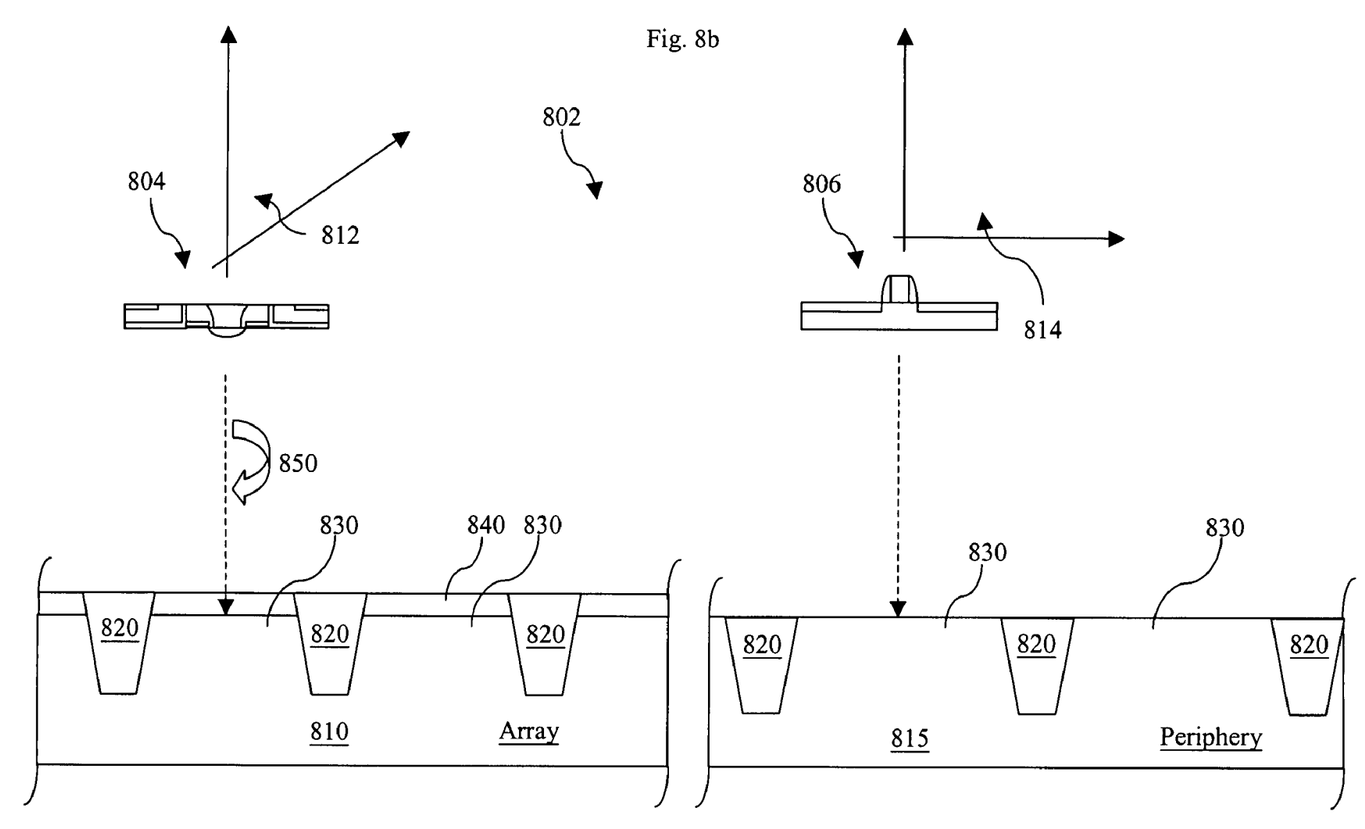

Referring to FIGS. 8a and 8b, illustrated are sectional views of another embodiment of an integrated circuit device 800 constructed according to aspects of the present disclosure. It is understood that the integrated circuit device 800 of FIGS. 8a and 8b illustrate intermediate stages of manufacture. The integrated circuit device 800 includes an array substrate 810, and a periphery substrate 815.

The array substrate 810 includes one or more memory devices 804 which may be located between isolation structures 820, in and/or on the array substrate 810. The memory device 804 may be substantially similar to the microelectronic device 100 shown in FIG. 5 and/or the integrated circuit device 700 shown in FIG. 7. The memory device 804 may be aligned substantially orthogonal relative to the device 806, such that a principal plane 812 of the device 804 may be substantially orthogonal relative to a corresponding principal plane 814 of the device 806. For example, the plane 812 may be angularly offset from the plane 814 by an angle about equal to 90 degrees, as indicated by the arrow 850. In other embodiment, the angular offset of the planes 812, 814 may range between 0 degrees and 90 degrees, exclusively. The array substrate 810 may include Si, SOI, SON, diamond, polymer, and/or other materials.

The periphery substrate 815 includes one or more device (s) 806 which may be located between isolation structures 820, in and/or on the periphery substrate 815. The device 806 may be substantially similar to the microelectronic device 724 shown in FIG. 7. The periphery substrate 815 may include Si, SOI, SON, diamond, polymer, and/or other materials. Devices formed in the periphery substrate 815 may be adapted for providing signal amplification and interconnectivity in conjunction with the memory device 804 and/or other devices formed in the array substrate 810.

Referring to FIG. 8a, the device 800 may include a semiconductor layer 840 located over active regions 830 of the array substrate 810 and proximate the sidewalls of the isolation structures 820. The layer 840 may include epitaxial Si, polysilicon, polyoxide, CoSi, NiSi, and/or other materials. The layer 840 may be blanket and/or selectively deposited substantially over the array substrate 810 and/or over the periphery substrate 815, such as by CVD, PECVD, PVD, ALD, and/or other methods, and subsequently etched back or otherwise planarized to the isolation structures 820 by CMP, plasma etching, and/or chemical etching.

The device 800 may also include a protective layer 860 for the protection of underlying features, such as the active regions 830 and the isolation structures 820. The protective layer 860 may comprise $SiO_2$, SiN, $Si_3N_4$, TiN, polymer, and/or other materials, including those having a dielectric constant ranging between about 5.5 and about 9. The protective layer 860 may be blanket and/or selectively deposited substantially over the periphery substrate 815, and/or over the array substrate 810. The protective layer 860 may be formed by CVD, PECVD, PVD, ALD, and/or other methods. The protective layer 860 may be patterned and etched away from the array substrate 810, thereby leaving the layer 860 within the periphery substrate 815.

Referring to FIG. 8b, the protective layer 860 may be removed from the periphery substrate 815 after subsequent processing. In one embodiment, the layer 860 may be removed prior to the formation of other materials upon the active regions 830 of the periphery substrate 815, such as those employed to form transistor devices.

The array substrate 810 and the periphery substrate 815 may be separate substrates bonded or otherwise coupled together, or may be adjacent or proximate regions of a common substrate. In one embodiment, the periphery substrate 815 may include one substrate material, and the array substrate 810 may include another substrate material. For example, the periphery substrate 815 may include a SON substrate, while the array substrate 810 may include a SOI substrate.

Figure 9A:
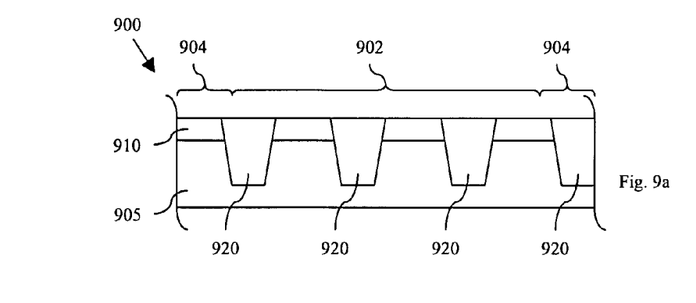
FIGS. 9a–9f are sectional views of another embodiment of a microelectronic device constructed according to aspects of the present disclosure.

Referring to FIG. 9a, illustrated is a sectional view of a microelectronic device 900 in an intermediate stage of manufacture according to aspects of the present disclosure. The microelectronic device 900 includes a substrate 905, a protective layer 910 formed over the substrate 905, and isolation structures 920 extending through the protective layer 910 and at least partially into the substrate 905. The microelectronic device 900 also includes a cell region 902 and a periphery region 904. For example, a plurality of memory devices may be located and/or subsequently formed in the cell region 902, and a plurality of logic devices may be located and/or subsequently formed in the periphery region 904. In one embodiment, the memory devices located and/or subsequently formed in the cell region 902 comprise memory transistor devices, possibly being substantially similar to the device 100 shown in FIG. 5, and the logic devices located and/or subsequently formed in the periphery region 904 may be MOSFET devices, FinFET devices, and/or other transistor devices employed in logic circuitry and/or sensing circuitry.

The substrate 905 may be substantially similar in composition and manufacture to the substrate 110 shown in FIG. 1. The substrate 905 may be a single crystal or other silicon substrate, a silicon-on-insulator (SOI) substrate comprising a silicon or germanium epitaxial layer on a silicon or sapphire substrate, a plastic or other flexible substrate, and/or other conventional or future-developed substrates. The substrate 905 may include a plurality of doped regions to be subsequently employed as doped wells, channel regions, source/drain regions, and/or for other purposes. In one embodiment, the doped regions may be doped in an alternating or checkerboard pattern, such as if the devices located and/or subsequently formed in the cell region 902 and/or the periphery region 904 include CMOS devices.

The protective layer 910 may comprise silicon oxide, silicon nitride (SiN, $Si_3N_4$, etc.) and/or other materials which may be employed as an etch stop or CMP stop. The protective layer 910 may be formed on or over the substrate 905 in the cell region 902 and the periphery region 904 by blanket or selective deposition, such as by CVD, LPCVD, PECVD, thermal process, ALD, PVD, and/or other processes, possibly to a thickness ranging between about 500 angstroms and about 5000 angstroms. In one embodiment, the protective layer 910 is substantially similar to the protective layer 860 shown in FIG. 8a. The protective layer 910 may also comprise a silicon oxide layer having a thickness ranging between about 50 and about 200 angstroms and a silicon nitride layer having a thickness ranging between about 1000 and about 2500 angstroms.

The isolation structures 920 may be or comprise shallow trench isolation (STI) or other electrically insulating features. For example, the isolation structures 920 may be formed by etching or otherwise forming openings extending through the protective layer 910 and at least partially into the substrate 905 and subsequently filling the openings with silicon dioxide and/or other dielectric materials. In one embodiment, the isolation structures 920 may be formed by a dry etching process, and may have a depth ranging between about 2000 angstroms and about 5000 angstroms. The bulk insulating material employed for the isolation structures 920 may be formed by CVD, HDP-CVD, PECVD, LPCVD, SACVD, and/or spin-on processing, and may have a thickness ranging between about 3000 angstroms and about 8000 angstroms. The isolation structures 920 may also be planarized by CMP processing to remove portions of the bulk insulating material, possibly removing between about 1000 angstroms and about 8000 angstroms and rendering the isolation structures 920 substantially coplanar with the protective layer 910, as shown FIG. 9*a*. The CMP processing may have a polishing selectivity ranging between about 2 and about 30 of the bulk insulating material relative to the protective layer.

Figure 9B:
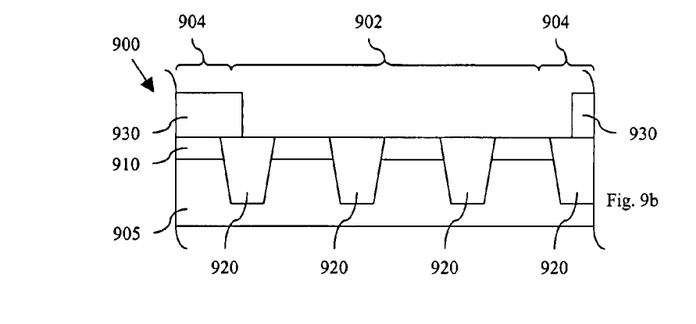

Referring to FIG. 9*b*, illustrated is a sectional view of the microelectronic device 900 shown in FIG. 9*a* in a subsequent stage of manufacture, in which a patterned photoresist or other masking layer 930 has been formed over portions of the protective layer 910. The masking layer may comprise a photo resist layer with a thickness ranging between about 3000 angstroms and about 10000 angstroms. The masking layer 930 may be formed over the substantial surface of the periphery region 904, and possibly over portions of one or more of the isolation structures 920 bordering the periphery region 904 and the cell region 902.

Figure 9C:
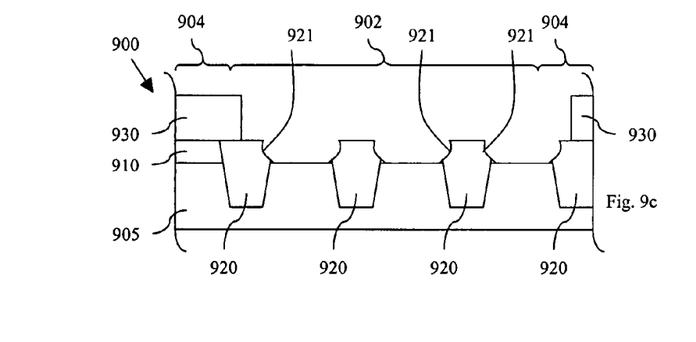

Referring to FIG. 9*c*, illustrated is a sectional view of the microelectronic device 900 shown in FIG. 9*b* in a subsequent stage of manufacture, in which the masking layer 930 has been employed as a mask during an etching process employed to remove portions of the protective layer 910. Because the masking layer 930 covers substantially none of the cell region 902, the portions of the protective layer 910 within the cell region 902 are removed by the etching process. However, portions of the protective layer 910 underlying the masking layer 930 are protected from the etching process. The etching process may employ a dry etch, a chemical etch, combinations thereof, and/or other processes. In one embodiment, portions of the protective layer 910 are removed by a wet etching process with an etching selectivity ranging between about 5 and about 30 for the protective layer 910 relative to the isolation structures 920.

Figure 9D:
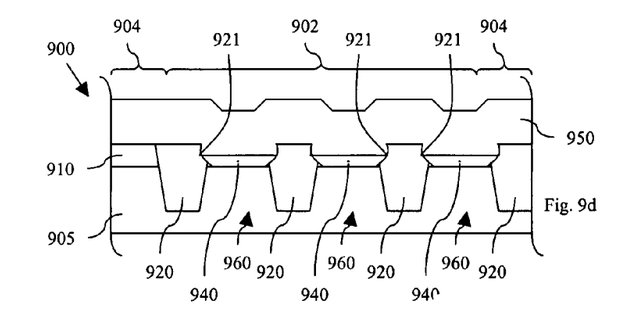

Referring to FIG. 9*d*, illustrated is a sectional view of the microelectronic device 900 shown in FIG. 9*c* in a subsequent stage of manufacture, in which the masking layer 930 has been etched away or otherwise removed. The masking layer 930 may be removed by one or more processes employing plasma ashing or chemical etching, possibly with $H_2SO_4$. After the masking layer 930 is removed, a gate dielectric pre-clean process may be employed to remove remaining portions of the protective layer 910. In one embodiment, the gate dielectric pre-clean process comprises a wet process using diluted HF or buffer oxide etching (BOE), possibly resulting in the formation of one or more divots 921 proximate top corners of the isolation structures 920. However, the divots 921 may also be at least partially formed during prior processing, as shown in FIG. 9*c*. The divots 921 may form as a result of the integration of multiple processes, including the planarization, removal of the protective layer 910, removal of the masking layer 930, and the gate dielectric pre-clean processing.

As shown in FIG. 9*d*, the gate dielectric layers 940 and a gate electrode layer 950 may be formed over the substrate 905. The gate dielectric layers 940 may be formed by exposing the portions of the substrate 905 exposed by the previous etching process to an oxidizing environment. In addition, or in the alternative, the gate dielectric layers 940 may be deposited on the exposed portions of the substrate 905, such as by CVD, PECVD, ALD, PVD, and/or other processes. The gate dielectric layers 940 may comprise silicon dioxide, silicon oxide, silicon oxynitride, and/or other materials, and may have a thickness ranging between about 10 angstroms and about 300 angstroms.

The gate electrode layer 950 may comprise polysilicon, amorphous silicon, and/or other semi-conducting materials, and may be formed by blanket deposition (as in the illustrated embodiment) or selective deposition. The gate electrode layer 950 may be formed by CVD, PECVD, ALD, PVD, and/or other processes, possibly to a thickness ranging between about 500 angstroms and about 4000 angstroms.

Figure 9E:
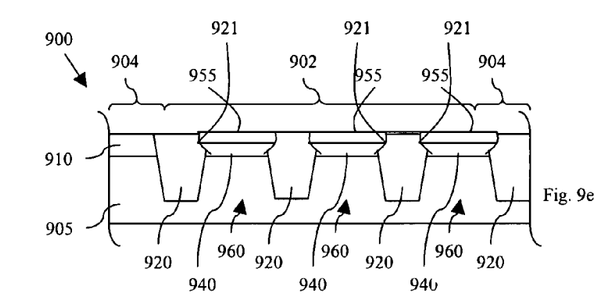

Referring to FIG. 9*e*, illustrated is a sectional view of the microelectronic device 900 shown in FIG. 9*d* in a subsequent stage of manufacture, in which portions of the gate electrode layer 950 have been removed to form gate electrodes 955. The portions of the gate electrode layer 950 may be removed by one or more dry etching processes, wet etching processes, etching back processes, chemical-mechanical planarizing or chemical-mechanical polishing (herein collectively referred to as CMP), and/or other processes, possibly employing the isolation structures 920 and/or the protective layer 910 as an end point. In one embodiment, the removing process removes between about 200 angstroms and about 2000 angstroms of the gate electrode layer 950, possibly leaving between about 300 angstroms and about 2000 angstroms of the gate electrode layer 950 overlying active regions 960. The selectivity of the gate electrode layer 950 relative to the protective layer 910 may range between about 5 and about 30. The selectivity of the gate electrode layer 950 to the isolation structures 920 may range between about 5 and about 30.

Figure 10:
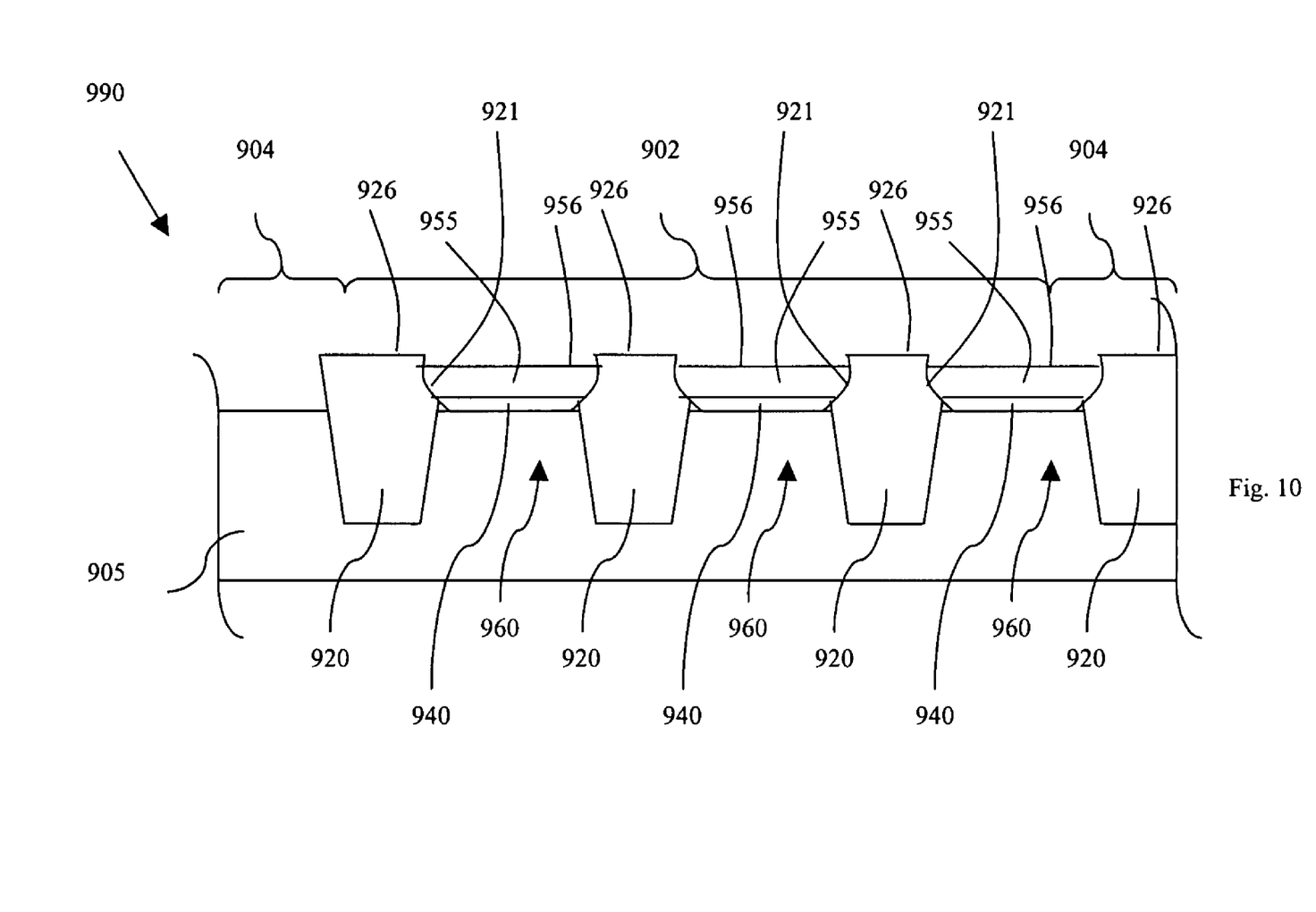
FIG. 10 is a sectional view of another embodiment of the microelectronic device shown in FIG. 9f according to aspects of the present disclosure.

The device formed in the cell region may be further processed by an over-etching or over-polishing process to remove remaining portions of the gate electrode layer 950 over the isolation structures 920. This over-etching or over-polishing process may also induce a recessed portion of the gate electrode layer 950 between the isolation structures 920, as shown in FIG. 9*e*. For example, a resulting gate electrode layer 955 may have a side surface directly contacting the isolation structures 920 and may have a common boundary with the surface of the divots 921. The gate electrode layers 955 may also include portions extending into the isolation structures 920 due to the previous formation of the divots 921. Thus, the gate electrode layers 955 may have a larger width than underlying active regions 960. In one embodiment, due to the recess of the gate electrode layers 955, top surfaces 956 of the gate electrode layers 955 may be lower than the top surfaces 926 of the isolation structures 920, as shown in FIG. 10. In one embodiment, the recess depth of the gate electrode layer 955 ranges between about 10 angstroms and about 500 angstroms. At this stage of manufacture, and/or at a later stage, the devices formed in the cell region 902 may be further processed to substantial completion before the remaining portions of the protective layer 910 are removed.

Figure 9F:
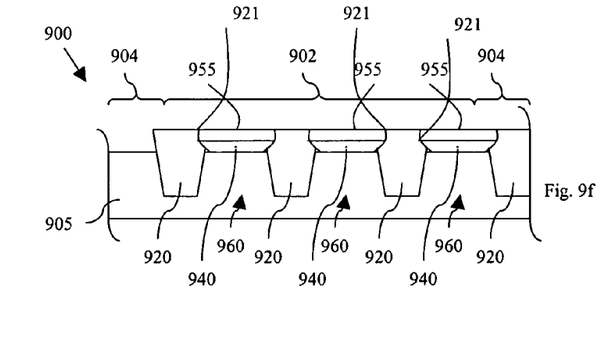

Referring to FIG. 9*f*, illustrated is a sectional view of the microelectronic device 900 shown in FIG. 9*e* in a subsequent stage of manufacture, in which the any remaining portions of the protective layer 910 have been removed. For example, a dry etch, chemical etch, and/or other process may be employed to remove the remaining portions of the protective layer 910, thereby exposing portions of the substrate 905 in the periphery region 904. In one embodiment, portions of the protective layer 910 are removed by a wet etching process with an etching selectivity ranging between about 5 and about 30 of the protective layer 910 relative to the isolation structures. The wet etching process may also have an etching selectivity ranging between about 5 and about 30 of the protective layer 910 relative to the gate electrode layer 955.

Thereafter, the exposed portions of the susbtrate 905 in the periphery region 904 may be further processed by conventional and/or future-developed means to fabricated MOSFETS and/or other transistors and logic and/or sensing circuitry in the periphery region 904. In one embodiment, the microelectronic device 900 is substantially similar to the integrated circuit device 700 shown in FIG. 7 and/or the device 800 shown in FIG. 8b.

Referring again to FIG. 10, illustrated is another embodiment of the integrated circuit device 900 according to aspects of the present disclosure, herein designated by the reference numeral 990. The integrated circuit device 990 includes a substrate having at least one memory cell region 902 and at least one periphery region 904, a plurality of isolation structures 920 located in the memory cell region 902, and a plurality of active regions 960 each located between proximate ones of the isolation structures 920. The device 990 also includes a plurality of gate electrode layers 955 each located between ones of the isolation structures 920 and overlying a corresponding one of the active regions 960, wherein each of the gate electrode layers 955 has a width greater than a separation distance of adjacent ones of the isolation structures 920 contacted by the corresponding gate electrode layer 955.

Each of the gate electrodes 955 includes a portion extending into an adjacent one of the isolation structures 920. For example, each of the gate electrodes 955 may include a side surface contacting an adjacent one of the isolation structures 920, such that each of the gate electrodes 955 overhangs a corresponding one of the active regions 960. The isolation structures 920 also each include a concave divot 921 having a profile corresponding to a convex profile of an end of an adjacent one of the gate electrodes 955.

Each of the isolation structures 920 also extends above the substrate 905 at least to a height of adjacent ones of the gate electrodes 955 over the substrate 905. Thus, each of the isolation structures 920 may extend substantially beyond adjacent ones of the gate electrodes 955 in a direction away from the substrate 905, or each of the plurality of gate electrodes 955 may extend no further away from the substrate 905 than adjacent ones of the isolation structures 920.

Thus, the present disclosure introduces a method of manufacturing a microelectronic device including, in one embodiment, providing a substrate having a plurality of partially completed microelectronic devices including at least one partially completed memory device and at least one partially completed transistor. At least a portion of the partially completed transistor is protected by forming a first layer over the portion of the partially completed transistor to be protected during a subsequent material removal step. A second layer is formed substantially covering the partially completed memory device and the partially completed transistor. Portions of the second layer are removed leaving a portion of the second layer over the partially completed memory device. At least a substantial portion of the first layer is removed from the partially completed transistor after the portions of the second layer are removed.

The present disclosure also provides method of manufacturing a microelectronic device including, in one embodiment, providing a substrate having a protective layer located thereon and a plurality of isolation structures extending through the protective layer and at least partially into the substrate. A mask is formed over a first portion of a surface collectively formed by the protective layer and the plurality of isolation structures, the masked first portion thereby sharing a boundary with an unmasked second portion of the surface. Sacrificial portions of the protective layer are removed from within the unmasked second portion, and the mask is removed. A conformal layer is formed over remaining portions of the protective layer, the isolation structures, and in voids created by the removal of the sacrificial portions of the protective layer. The conformal layer is planarized such that the conformal layer, the isolation structures, and the remaining portions of the protective layer are substantially coplanar. The remaining portions of the protective layer are removed, and transistors are formed in voids created by the removal of the remaining portions of the protective layer.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a microelectronic device, comprising:

providing a substrate having a protective layer located thereon and a plurality of isolation structures extending through the protective layer and at least partially into the substrate;

forming a mask over a first portion of a surface collectively formed by the protective layer and the plurality of isolation structures, the masked first portion thereby sharing a boundary with an unmasked second portion of the surface;

removing sacrificial portions of the protective layer from within the unmasked second portion;

removing the mask;

forming a conformal layer over remaining portions of the protective layer, the isolation structures, and in voids created by the removal of the sacrificial portions of the protective layer;

planarizing the conformal layer such that the conformal layer, the isolation structures, and the remaining portions of the protective layer are substantially coplanar;

removing the remaining portions of the protective layer; and forming transistors in voids created by the removal of the remaining portions of the protective layer;

wherein planarizing the conformal layer comprises planarizing by at least one of a chemical mechanical polishing (CMP) process and an etching process.

2. The method of claim 1 wherein planarized portions of the conformal layer located between opposing isolation structures at least partially form a memory device.

3. The method of claim 2 wherein the memory device is a floating gate field effect transistor device.

4. The method of claim 1 wherein the transistors formed in the voids include MOSFETs.

5. The method of claim 1 wherein the substrate is selected from the group consisting of:

a silicon containing substrate;

a silicon-on-insulator (SOI) substrate;

a germanium epitaxial layer on a silicon substrate;
a germanium epitaxial layer on a sapphire substrate;
a silicon on nothing (SON) substrate:
a plastic substrate; and
a flexible substrate.

6. The method of claim 1 wherein the protective layer comprises a dielectric material having a dielectric constant ranging between about 5.5 and about 9.

7. The method of claim 1 wherein the protective layer comprises a nitrogen containing layer.

8. The method of claim 1 wherein the protective layer comprises an oxygen containing layer.

9. The method of claim 1 wherein the conformal layer comprises a gate electrode layer.

10. The method of claim 9 wherein the gate electrode layer has a thickness ranging between about 300 angstroms and about 2000 angstroms.

11. The method of claim 9 wherein the gate electrode layer comprises a silicon containing layer formed by an LPCVD process.

12. The method of claim 1 further comprising forming a recessed portion of the conformal layer after planarizing the conformal layer.

13. A method of manufacturing a microelectronic device, comprising:
providing a substrate having a protective layer located thereon and a plurality of isolation structures extending through the protective layer and at least partially into the substrate, the substrate including at least one memory cell region and at least one periphery region;
forming a mask over a at least a portion of the periphery region and exposing at least a portion of the memory cell region;
removing sacrificial portions of the protective layer from within the memory cell region;
removing the mask;
forming a conformal layer over remaining portions of the protective layer, the isolation structures, and in voids created by the removal of the sacrificial portions of the protective layer;
planarizing the conformal layer such that the conformal layer, the isolation structures, and the remaining portions of the protective layer are substantially coplanar;
removing the remaining portions of the protective layer; and
forming transistors in voids created by the removal of the remaining portions of the protective layer.

14. The method of claim 13 wherein the memory device is a floating gate field effect transistor device.

15. The method of claim 13 wherein the substrate is selected from the group consisting of:
a silicon containing substrate;
a silicon-on-insulator (SOI) substrate;
a germanium epitaxial layer on a silicon substrate;
a germanium epitaxial layer on a sapphire substrate;
a silicon on nothing (SON) substrate;
a plastic substrate; and
a flexible substrate.

16. The method of claim 13 wherein the protective layer comprises a dielectric material having a dielectric constant ranging between about 5.5 and about 9.

17. The method of claim 13 wherein the protective layer comprises a nitrogen containing layer.

18. The method of claim 13 wherein the protective layer comprises an oxygen containing layer.

19. The method of claim 13 wherein the conformal layer comprises a gate electrode layer.

20. The method of claim 19 wherein the gate electrode layer has a thickness ranging between about 300 angstroms and about 2000 angstroms.

21. The method of claim 13 wherein the gate electrode layer comprises a silicon containing layer formed by a LPCVD process.

22. The method of claim 13 wherein planarizing the conformal layer comprises planarizing by at least one of a chemical mechanical polishing (CMP) process and an etching process.

23. The method of claim 13 further comprising forming a recessed portion of the conformal layer after planarizing the conformal layer.

24. A method of manufacturing a microelectronic device, comprising:
providing a substrate having a protective layer located thereon and a plurality of isolation structures extending through the protective layer and at least partially into the substrate, the substrate including at least one memory cell region and at least one periphery region;
forming a mask over a at least a portion of the periphery region and exposing at least a portion of the memory cell region;
removing sacrificial portions of the protective layer from within the memory cell region;
removing the mask;
forming a conformal layer over remaining portions of the protective layer, the isolation structures, and in voids created by the removal of the sacrificial portions of the protective layer;
planarizing the conformal layer such that the conformal layer, the isolation structures, and the remaining portions of the protective layer are substantially coplanar;
removing the remaining portions of the protective layer; and
forming transistors in voids created by the removal of the remaining portions of the protective layer, wherein the transistors formed in the voids include MOSFETs.

* * * * *